US012677580B2

(12) United States Patent
Jeong

(10) Patent No.: US 12,677,580 B2
(45) Date of Patent: Jul. 7, 2026

(54) DISPLAY DEVICE

(71) Applicant: Samsung Display Co., LTD., Yongin-si (KR)

(72) Inventor: Hee Soon Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 347 days.

(21) Appl. No.: 18/080,950

(22) Filed: Dec. 14, 2022

(65) Prior Publication Data

US 2023/0263037 A1 Aug. 17, 2023

(30) Foreign Application Priority Data

Feb. 16, 2022 (KR) ........................ 10-2022-0020439

(51) Int. Cl.
*H10K 59/88* (2023.01)
*H10K 59/12* (2023.01)
*H10K 59/35* (2023.01)

(52) U.S. Cl.
CPC ............. *H10K 59/88* (2023.02); *H10K 59/12* (2023.02); *H10K 59/353* (2023.02)

(58) Field of Classification Search
CPC ..................... H10K 59/351–353; H10K 59/88
See application file for complete search history.

(56) References Cited

U.S. PATENT DOCUMENTS

| | | | |
|---|---|---|---|
| 9,892,691 B1 | 2/2018 | Lim et al. | |
| 2018/0005561 A1* | 1/2018 | Moon | G09G 3/3208 |
| 2021/0057494 A1 | 2/2021 | Chung et al. | |
| 2021/0065625 A1* | 3/2021 | Wang | G09G 3/3233 |
| 2022/0037422 A1* | 2/2022 | Zhang | G09G 3/2003 |
| 2022/0069028 A1* | 3/2022 | Jang | H10K 50/822 |
| 2022/0223673 A1* | 7/2022 | Xu | H10K 59/1213 |
| 2022/0293696 A1* | 9/2022 | Xin | H10K 59/88 |
| 2022/0320187 A1* | 10/2022 | Huang | G09G 3/3208 |

FOREIGN PATENT DOCUMENTS

| | | |
|---|---|---|
| CN | 110874990 | 3/2020 |
| CN | 111708199 | 9/2020 |
| CN | 111785761 | 10/2020 |
| CN | 112151591 | 12/2020 |
| KR | 10-2021-0022818 A | 3/2021 |

* cited by examiner

*Primary Examiner* — Eric K Ashbahian
(74) *Attorney, Agent, or Firm* — Sughrue Mion, PLLC

(57) ABSTRACT

A display device includes: a plurality of first pixels disposed in a first pixel area, each of the plurality of first pixels including a plurality of first sub-pixel groups; a plurality of second pixels disposed in a second pixel area surrounded by the first pixel area, each of the plurality of second pixels including a plurality of second sub-pixel groups; and a plurality of dummy pixels disposed at edge portions of the second pixel area. A pixel density of the second pixel area is lower than a pixel density of the first pixel area, and the plurality of dummy pixels emit light of different colors according to positions of the edge portions of the second pixel area.

16 Claims, 7 Drawing Sheets

◇ R1   ◆ G1a   ◆ G1b   ◇ B1   ▨ R2   ▦ G2   ▦ B2   ◆ R3   ◇ G3   ◇ B3

DR2
↑
DR3 •→ DR1

DISPLAY DEVICE

CROSS-REFERENCE TO RELATED APPLICATION(S)

This application claims priority to and the benefit of Korean Patent Application No. 10-2022-0020439 under 35 U.S.C. § 119, filed on Feb. 16, 2022, in the Korean Intellectual Property Office (KIPO), the entire contents of which are incorporated herein by reference.

BACKGROUND

1. Technical Field

Embodiments relate to a display device.

2. Description of the Related Art

A display device includes a liquid crystal display (LCD), a plasma display panel (PDP), an organic light emitting diode (OLED) display, a field emission display (FED), and an electrophoretic display device.

The display device may include an optical device such as a sensor or a camera. The optical device may be disposed to a bezel region, e.g., a region surrounding the screen, of the display device to avoid interference with the screen.

In case that the size of the bezel of the display device is reduced, the screen-to-body ratio of the display device, e.g., the ratio that the screen occupies in case that the display device is viewed from the front, may be increased. The screen-to-body ratio may be a barometer of the technology level of the display device as well as an important factor in the consumer's product selection.

As the size of the bezel of the display device is reduced, it has been difficult to dispose the optical device to the bezel region, and accordingly, a technology for disposing the optical device within the screen is being developed.

With disposing the optical device within the screen, the arrangement of pixels of the display device may be different in a transparent region for disposing the optical device and a display region for disposing the pixels, and pixels displaying different colors at the boundary of two regions with different pixel arrangement may affect each other, thereby causing display quality deterioration such as color shift due to interference.

The above information disclosed in this Background section is only for enhancement of understanding of the background of the invention, and therefore it may contain information that does not form the prior art that is already known in this country to a person of ordinary skill in the art.

SUMMARY

Embodiments provide a display device including an optical device disposed in a screen. The display device is capable of preventing or minimizing display quality deterioration, which is caused by color shift at the periphery of the optical device.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include: a plurality of first pixels disposed in a first pixel area, each of the plurality of first pixels including a plurality of first sub-pixel groups; a plurality of second pixels disposed in a second pixel area surrounded by the first pixel area, each of the plurality of second pixels including a plurality of second sub-pixel groups; and a plurality of dummy pixels disposed at edge portions of the second pixel area, wherein a pixel density of the second pixel area may be lower than a pixel density of the first pixel area, and the plurality of dummy pixels emitting light of different colors may be differently arranged according to positions of the edge portions of the second pixel area.

The plurality of first sub-pixel groups may include a first sub-pixel, a second sub-pixel, a third sub-pixel, and a fourth sub-pixel, the plurality of second sub-pixel group may include a fifth sub-pixel, a sixth sub-pixel, and a seventh sub-pixel, the plurality of dummy pixels may include a first dummy pixel, a second dummy pixel, and a third dummy pixel, the first sub-pixel, the fifth sub-pixel, and the first dummy pixel may emit light of a first color, the second sub-pixel, the fourth sub-pixel, the sixth sub-pixel, and the second dummy pixel may emit light of a second color, and the third sub-pixel, the seventh sub-pixel, and the third dummy pixel may emit light of a third color.

The first dummy pixel may be disposed between the sixth sub-pixel and the seventh sub-pixel, the second dummy pixel may be disposed between the seventh sub-pixel and the fifth sub-pixel, and the third dummy pixel is disposed adjacent to the fifth sub-pixel.

The first sub-pixel, the second sub-pixel, the third sub-pixel, and the fourth sub-pixel may be sequentially disposed in a zigzag pattern along a first direction and a second direction in a plan view, the sixth sub-pixel may be disposed below the fifth sub-pixel along the second direction in a plan view, and the seventh sub-pixel may be disposed adjacent to the fifth sub-pixel and the sixth sub-pixel along the first direction in a plan view.

In a first region of a boundary area between the first pixel area and the second pixel area, the first sub-pixel, the fourth sub-pixel, and the third dummy pixel may be sequentially disposed along a first diagonal direction between the first direction and the second direction.

In a second region of the boundary area between the first pixel area and the second pixel area, the seventh sub-pixel, the first dummy pixel, and the sixth sub-pixel may be sequentially disposed along the first diagonal direction.

In a third region of the boundary area between the first pixel area and the second pixel area, the third sub-pixel, the fourth sub-pixel, and the first dummy pixel may be sequentially disposed along a second diagonal direction between the first direction and the second direction.

In a fourth region of the boundary area between the first pixel area and the second pixel area, the fifth sub-pixel, the seventh sub-pixel, and the second dummy pixel may be sequentially disposed along the second diagonal direction.

In a fifth region of a boundary area between the first pixel area and the second pixel area the second pixel area, the first dummy pixel and the third dummy pixel may be disposed along the second direction in a portion adjacent between the second sub-pixel and the fourth sub-pixel.

In a sixth region of the boundary area between the first pixel area and the second pixel area, the second dummy pixel may be disposed along the second direction in a portion adjacent to the first sub-pixel and the third sub-pixel.

In a seventh region of the boundary area between the first pixel area and the second pixel area, the first sub-pixel, the seventh sub-pixel, and the second dummy pixel may be sequentially disposed along a first diagonal direction between the first direction and the second direction.

In an eighth region of the boundary area between the first pixel area and the second pixel area, the third sub-pixel, the fourth sub-pixel, and the first dummy pixel may be sequentially disposed along a second diagonal direction between the first direction and the second direction.

In a ninth region of the boundary area between the first pixel area and the second pixel area, the fifth sub-pixel, the seventh sub-pixel, and the second dummy pixel may be sequentially disposed along the second diagonal direction.

In an embodiment, a display device may include: a plurality of first pixels disposed in a first pixel area, each of the plurality of first pixels including a plurality of first sub-pixel groups, are disposed; a plurality of second pixels disposed in a second pixel area surrounded by the first pixel area, each of the plurality of second pixels including a plurality of second sub-pixel groups; and a plurality of dummy pixels disposed at edge portions of the second pixel area, wherein a size of a light emitting portion of the plurality of dummy pixels may be smaller than a size of a light emitting portion of the plurality of second sub-pixel groups.

The plurality of first sub-pixel groups may include a first sub-pixel, a second sub-pixel, a third sub-pixel, and a fourth sub-pixel, the plurality of second sub-pixel groups may include a fifth sub-pixel, a sixth sub-pixel, and a seventh sub-pixel, the plurality of dummy pixels may include a first dummy pixel, a second dummy pixel, and a third dummy pixel, the first sub-pixel, the fifth sub-pixel, and the first dummy pixel may emit light of a first color, the second sub-pixel, the fourth sub-pixel, the sixth sub-pixel, and the second dummy pixel may emit light of a second color, and the third sub-pixel, the seventh sub-pixel, and the third dummy pixel may emit light of a third color.

In the first pixel area, the first sub-pixel, the second sub-pixel, the third sub-pixel, and the fourth sub-pixel may be sequentially disposed in a zigzag pattern along a first direction and a second direction in a plan view, and in the second pixel area, the sixth sub-pixel may be disposed below the fifth sub-pixel along the second direction, and the seventh sub-pixel may be disposed adjacent to the fifth sub-pixel and the sixth sub-pixel along the first direction in a plan view.

In a first sub-area of a boundary area between the first pixel area and the second pixel area, the first sub-pixel, the fourth sub-pixel, and the third dummy pixel may be sequentially disposed along a first diagonal direction between the first direction and the second direction, and in the first sub-area, the seventh sub-pixel, the first dummy pixel, and the sixth sub-pixel may be sequentially disposed along the first diagonal direction.

In the first sub-area, the third sub-pixel, the fourth sub-pixel, and the first dummy pixel may be sequentially disposed along a second diagonal direction between the first direction and the second direction, and in the first sub-area, the fifth sub-pixel, the seventh sub-pixel, and the second dummy pixel may be sequentially disposed along the second diagonal direction.

In a second sub-area of the boundary area between the first pixel area and the second pixel area, the first dummy pixel and the third dummy pixel may be disposed between the second sub-pixel and the fourth sub-pixel along the second direction, and in the second sub-area, the second dummy pixel may be disposed to a portion adjacent to the first sub-pixel and the third sub-pixel along the second direction.

In a third sub-area of the boundary area between the first pixel area and the second pixel area, the first sub-pixel, the seventh sub-pixel, and the second dummy pixel may be sequentially disposed along the first diagonal direction.

In the third sub-area, the third sub-pixel, the fourth sub-pixel, and the first dummy pixel may be sequentially disposed along the second diagonal direction, and in the third sub-area, the fifth sub-pixel, the seventh sub-pixel, and the second dummy pixel may be sequentially disposed along the second diagonal direction.

According to the embodiments, the optical device is disposed in the screen, and display quality deterioration, which may occur at the periphery of the optical device, may be prevented.

However, the effects of the embodiments are not limited to the above-described effects, and it is evident that the invention may be variously expanded within a range that does not deviate from the spirit and region of the invention.

DETAILED DESCRIPTION OF THE EMBODIMENTS

Figure 1:
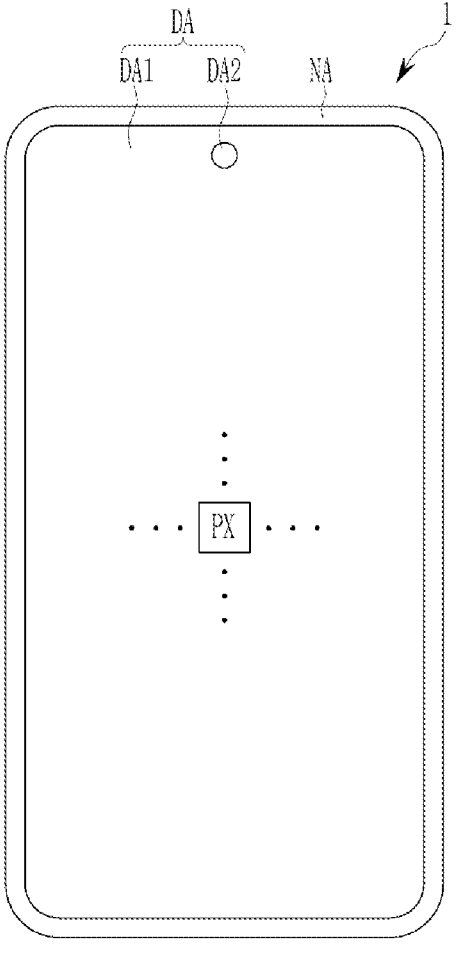
FIG. 1 is a schematic top plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Further, throughout the specification, the phrase "on a plane" means viewing a target portion from the top, and the phrase "on a cross-section" means viewing a cross-section formed by vertically cutting a target portion from the side.

Hereinafter, various embodiments and variations will be described in detail with reference to the accompanying drawings.

Figure 2:
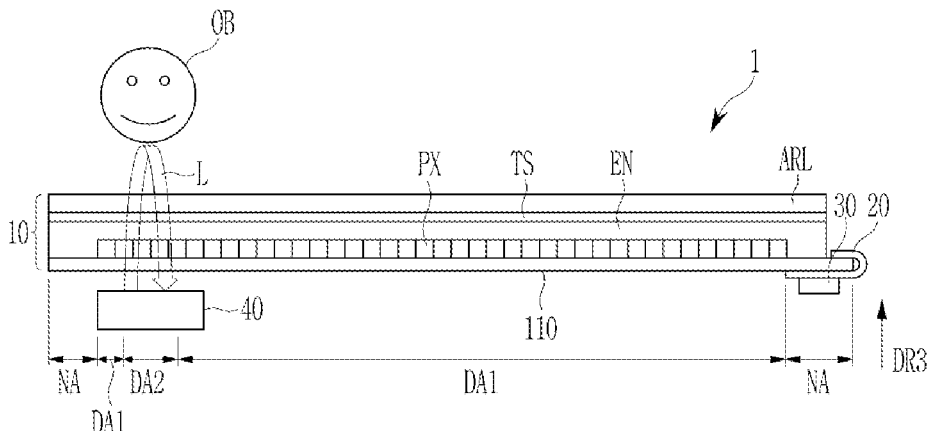
FIG. 2 is a schematic cross-sectional view of the display device according to the embodiment.

Referring to FIGS. 1 and 2, a display device according to an embodiment will be schematically described. FIG. 1 is a schematic plan view of a display device according to an embodiment, and FIG. 2 is a schematic cross-sectional view of the display device according to an embodiment.

Referring to FIGS. 1 and 2, a display device 1 may include a driving unit including a display panel 10, a flexible printed circuit film 20 connected to the display panel 10, an integrated circuit (IC) chip 30, and the like, and an optical device 40.

The display panel 10 may include a display area DA where an image is displayed, and a non-display area NA where no image is displayed therein. For example, the non-display area NA may surround the display area DA. The display area DA may correspond to a screen. The display panel 10 may display an image and may detect a touch.

Pixels PX may be positioned in the display area DA. For example, each of the pixels PX may be a minimum unit for displaying an image. For example, each pixel PX may display a specific color, for example, any one of red, green, and blue, with various luminance according to an input image signal.

In the non-display area NA, circuits and/or signal lines for generating and/or transmitting various signals applied to the display area DA may be disposed. Signal lines such as a gate line, a data line, and a driving voltage line may be connected to each pixel PX, and the pixel PX may receive a gate signal, a data voltage, a driving voltage, and the like from these signal lines.

The display area DA may include a first pixel area in the form of a first display area DA1 and a second pixel area in the form of a second display area DA2. The second display area DA2 may have a higher transmittance than the first display area DA1 such that that the second display area DA2 may perform other functions in addition to the unique function of displaying an image. Here, the transmittance means transmittance of light passing through the display panel 10 in the third direction DR3. The light may be light of a wavelength other than visible light and/or visible light (e.g., infrared light). The second display area DA2 may have a smaller density of pixels PX than the first display area DA1. For example, the number of pixels PX per unit area (e.g., a pixel density) of the second display area DA2 may be smaller than that of the first display area DA1.

In the display area DA, the second display area DA2 may be disposed in various ways. For example, the second display area DA2 may be positioned within the first display area DA1 and may be surrounded by the first display area DA1.

The second display area DA2 may be positioned adjacent to the non-display area NA. For example, the second display area DA2 may be positioned at the top area (or the upper area) of the display area DA (e.g., in a plan view). For example, the second display area DA2 may positioned at the center area of the display area DA in case that the display area DA is divided into the left, right, and/or center areas. The second display area DA2 may be positioned at a location defined by the first direction DR1 across the top area of the display area DA and the second direction DR2 across the left end and/or right end of the display area DA. The second display area DA2 may have various shapes such as polygons such as a quadrangle, a triangle, a circle, and an oval.

The second display area DA2 may have a smaller area than the first display area DA1. In the illustrated embodiment, although the second display area DA2 has a substantially circular shape, embodiments are not limited thereto, and the second display area DA2 may have various shapes such as polygons.

In the non-display area NA of the display panel 10, a driving unit, which generates and/or processes various signals for driving the display panel 10, may be positioned. The driving unit may include a data driver applying a data voltage to data lines, a gate driver applying a gate signal to gate lines, and a signal controller controlling the data driver and the gate driver.

The data driver and the gate driver may be integral with each other on the display panel 10 and may be positioned on either side or both sides (e.g., opposite sides) of the display area DA. The data driver and the signal controller may be formed as an IC chip (also referred to as a driving IC chip) 30, and the IC chip 30 may be mounted on the flexible printed circuit film 20 and connected (e.g., electrically connected) to the display panel 10. The IC chip 30 may be mounted in the non-display area NA of the display panel 10.

The display panel 10 may include a substrate 110, and the pixels PX may be formed on the substrate 110. The substrate 110 may be positioned continuously over the first display area DA1 and the second display area DA2.

The display panel 10 may include an encapsulation layer EN that covers (e.g., completely covers) the pixels PX. The encapsulation layer EN may seal the first display area DA1 and the second display area DA2 to prevent penetration (or permeation) of moisture or oxygen into the display panel 10.

A touch sensor layer TS may be positioned on the encapsulation layer EN. An area of the touch sensor layer TS capable of sensing a touch may coincide with the display area DA.

Touch electrodes may be positioned in the touch sensor layer TS. At least one touch electrode may be disposed over the pixels PX. The touch electrode may be formed of a metal mesh. The touch electrode may be formed of a metallic material such as titanium, aluminum, copper, or molybdenum, or a transparent conductive material such as an indium tin oxide (ITO) or an indium zinc oxide (IZO). The touch electrode may be formed as a single layer or a multilayer.

The touch electrodes may sense a user's contact or non-contact touch. Each touch electrode may sense a touch by a self-capacitor method, or adjacent touch electrodes may sense a touch by a mutual capacitor method. The display panel 10 may be called a touch screen panel. The display device 1 may include a touch driver that generates signals for driving the touch electrodes and processes signals received from the touch electrodes. For example, the touch driver may be formed as an IC chip.

An anti-reflective layer ARL for reducing or preventing external light reflection may be positioned on the touch sensor layer TS. The anti-reflective layer ARL may include a light blocking member and a color filter. The anti-reflective layer ARL will be described in more detail below.

The optical device 40 may be positioned on the rear surface of the display panel 10 to overlap the display panel 10, and may correspond to (or overlap) the entire second display area DA2, or may correspond to (or overlap) only a part of the second display area DA2. For example, optical devices 40 may be disposed in the second display area DA2.

The optical device 40 may be a camera, a sensor, or a flash, and in case that the optical device 40 is a sensor, the optical device 40 may be a proximity sensor or an illuminance sensor. Light of the wavelength used by the optical device 40 may pass through the display panel 10 with higher transmittance through the second display area DA2.

The optical device 40 may emit light L of a certain wavelength range toward an object OB positioned in front of the display panel 10 or receive light L reflected from the object OB. The light L of a constant wavelength range may be light of a wavelength that is processed by the optical device 40, and may be visible light and/or infrared light, and light of a certain wavelength may pass through a transmission region positioned in the second display area DA2. In case that the optical device 40 uses infrared light, light of a certain wavelength may have a wavelength region of about 900 nm to about 1000 nm. The optical device 40 may receive light of a certain wavelength irradiated to the front of the display panel 10.

In addition to the optical device 40, various electronic devices may be positioned on the rear side of the display panel 10.

Figure 3:
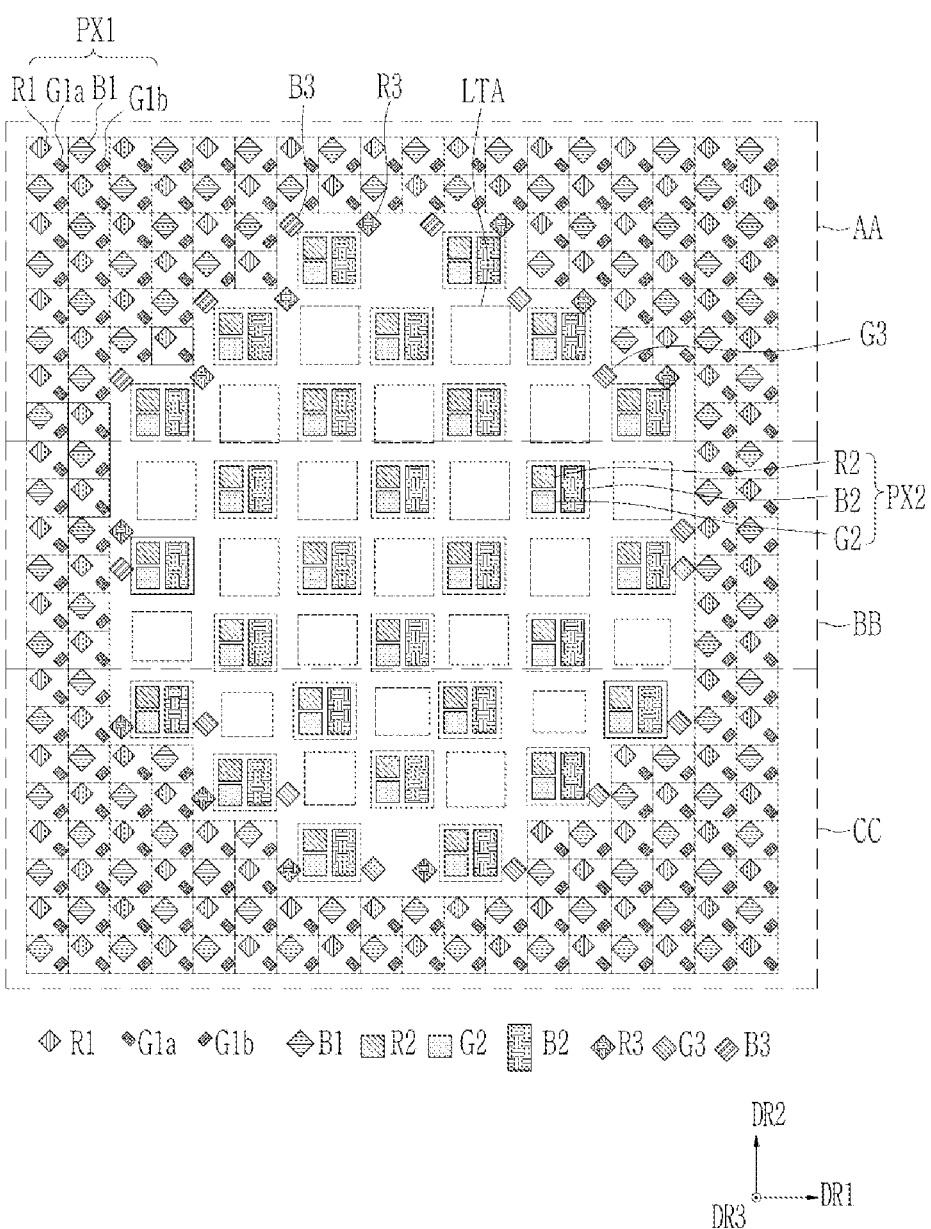
FIG. 3 is a schematic layout view of an adjacent portion of the first display area and the second display area of the display device according to an embodiment.

Referring to FIG. 3 together with FIGS. 1 and 2, a first display area DA1 and a second display area DA2 of the display device 1 according to an embodiment will be described. FIG. 3 is a schematic layout view of an adjacent portion of the first display area and the second display area of the display device 1 according to an embodiment.

Referring to FIG. 3, the first display area DA1 may include first pixels PX1, and the second display area DA2 may include second pixels PX2. The second display area DA2 may be disposed in the first display area DA1 and may be surrounded by the first display area DA1.

The second display area DA2 may include a light transmissive area LTA positioned between adjacent second pixels PX2.

Each of the first pixels PX1 in the first display area DA1 may include a pixel circuit unit including at least one transistor and a display unit including a pixel electrode connected to the pixel circuit unit and emitting light. For example, each of the second pixels PX2 in the second display area DA2 may include a pixel circuit unit including at least one transistor and a display unit including a pixel electrode connected to the pixel circuit unit and emitting light.

Each of the first pixels PX1 in the first display area DA1 may include a first sub-pixel R1, a second sub-pixel G1a, a third sub-pixel B1, and a fourth sub-pixel G1b. The first sub-pixel R1, the second sub-pixel G1a, the third sub-pixel B1, and the fourth sub-pixel G1b may form a dot DOT corresponding to the first pixel PX1 (as a single pixel).

In the first display area DA1, the first sub-pixel R1, the second sub-pixel G1a, the third sub-pixel B1, and the fourth sub-pixel G1b may be disposed in a zigzag form along the first direction DR1 and the second direction DR2.

In more detail, in the first display area DA1, the first sub-pixel R1 and the second sub-pixel G1a may form a first pair and may be disposed diagonally from each other, the third sub-pixel B1 and the fourth sub-pixel G1b may form a second pair and may be disposed diagonally from each other. For example, the first pair of the first sub-pixel R1 and the second sub-pixel G1a and the second pair of the third sub-pixel B1 and the fourth sub-pixel G1b may be alternately disposed along the first direction DR1 and the second direction DR2.

Therefore, the first sub-pixel R1 and the third sub-pixel B1 may be positioned in an upper area of the first pixel PX1, and the second sub-pixel G1a and the fourth sub-pixel G1b may be positioned in a lower area of the first pixel PX1 (e.g., in a plan view).

Each of the second pixels PX2 in the second display area DA2 may include a fifth sub-pixel R2, a sixth sub-pixel G2, and a seventh sub-pixel B2. The fifth sub-pixel R2, the sixth sub-pixel G2, and the seventh sub-pixel B2 may form a dot DOT that is the second pixel PX2 (as a single pixel).

In the second display area DA2, the sixth sub-pixel G2 may be positioned below the fifth sub-pixel R2 (e.g., in the second direction DR2), and the seventh sub-pixel B2 may be positioned at the right of the fifth sub-pixel R2 and at the right of the sixth sub-pixel G2 (e.g., in the first direction DR1).

First dummy pixels R3, second dummy pixels G3, and third dummy pixels B3 may be positioned at edge portions of the second display area DA2.

The first sub-pixel R1 and the fifth sub-pixel R2 may emit light of the same color (e.g., a first color), the second sub-pixel G1a, the fourth sub-pixel G1b, and the sixth sub-pixel G2 may emit light of the same color (e.g., a second color), and the third sub-pixel B1 and the seventh sub-pixel B2 may emit light of the same color (e.g., a third color). For example, the first color may be red, the second color may be green, and the third color may be blue, but embodiments are not limited thereto. For example, the first color, the second color, and the third color may include combinations of various primary colors.

The first display area DA1 of the display device 1 may display images of various colors by a combination of the first sub-pixel R1, the second sub-pixel G1a, the third sub-pixel B1, and the fourth sub-pixel G1b, and the second display area DA2 may display images of various colors by a combination of the fifth sub-pixel R2, the sixth sub-pixel G2, and the seventh sub-pixel B2.

In a portion adjacent to the boundaries of the first display area DA1 and the second display area DA2, first dummy pixels R3, second dummy pixels G3, and third dummy pixels B3 may be positioned between the most adjacent first pixel PX1 and second pixel PX2 among the first pixels PX1 of the first display area DA1 and the second pixels PX2 of the second display area DA2.

According to the positions of the first pixel PX1 and the second pixel PX2 adjacent to each other, the colors of light emitted by the adjacent dummy pixels R3, G3, and B3 may be different from each other. For example, the number of the first dummy pixels R3, the number of the second dummy pixels G3, and the number of the third dummy pixels B3 may be different from each other.

The first dummy pixels R3, the first sub-pixel R1, and the fifth sub-pixel R2 may emit light of the same color (e.g., the first color). For example, the second dummy pixels G3, the second sub-pixel G1a, the fourth sub-pixel G1b, and the sixth sub-pixel G2 may emit light of the same color (e.g., the second color). For example, the third dummy pixels B3, the third sub-pixel B1, and the seventh sub-pixel B2 may emit light of the same color (e.g., the third color). As described above, the first color may be red, the second color may be green, and the third color may be blue.

Light emitting portions of the first sub-pixel R1, the second sub-pixel G1a, the third sub-pixel B1, and the fourth sub-pixel G1b of the first display area DA1 may have a substantially rhombus planar shape, and light emitting portions of the fifth sub-pixel R2, the sixth sub-pixel G2, and the seventh sub-pixel B2 of the second display area DA2 may have a substantially quadrangle planar shape.

The size of the light emitting portion of the second sub-pixel G1a and the size of the light emitting portion of the fourth sub-pixel G1b may be substantially the same as each other, and the size of the light emitting portion of the second sub-pixel G1a and the size of the light emitting portion of the fourth sub-pixel G1b may be smaller than the size of the light emitting portion of the first sub-pixel R1 and the size of the light emitting portion of the third dummy pixel B3.

The size of the light emitting portion of the fifth sub-pixel R2, the size of the light emitting portion of the sixth sub-pixel G2, and the size of the light emitting portion of the seventh sub-pixel B2 may be larger than the size of the light emitting portion of the first sub-pixel R1 and the size of the light emitting portion of the third dummy pixel B3. For example, the size of the light emitting portion of the seventh sub-pixel B2 may be larger than the size of the light emitting portion of the fifth sub-pixel R2 and the size of the light emitting portion of the sixth sub-pixel G2.

The size of the light emitting portion of the first dummy pixel R3, the size of the light emitting portion of the second dummy pixel G3, and the size of the light emitting portion of the third dummy pixel B3 may be substantially the same as the size of the light emitting portion of the first sub-pixel R1 and the size of the third sub-pixel B1.

For example, the light emitting portions of the first dummy pixel R3, the second dummy pixel G3, and the third dummy pixel B3 may have a substantially rhombus planar shape.

Pixels PX may not be formed in the light transmissive area LTA of the second display area DA2. Light may pass through the display panel 10 in the third direction DR3 through the light transmissive area LTA.

In the embodiment shown in FIG. 3, the second pixel PX2 may be positioned between two adjacent light transmissive areas LTA. For example, the area of each of light transmissive areas LTA and the area of the second pixel PX2 may be substantially the same as each other, but embodiments are not limited thereto. For example, the alignment and the number of the light transmissive areas LTA may be varied or modified. For example, the light transmissive areas LTA may be arranged in a substantially matrix form in the second display area DA2. For example, the second pixels PX2 may be positioned between adjacent light transmissive areas LTA.

Figure 4:
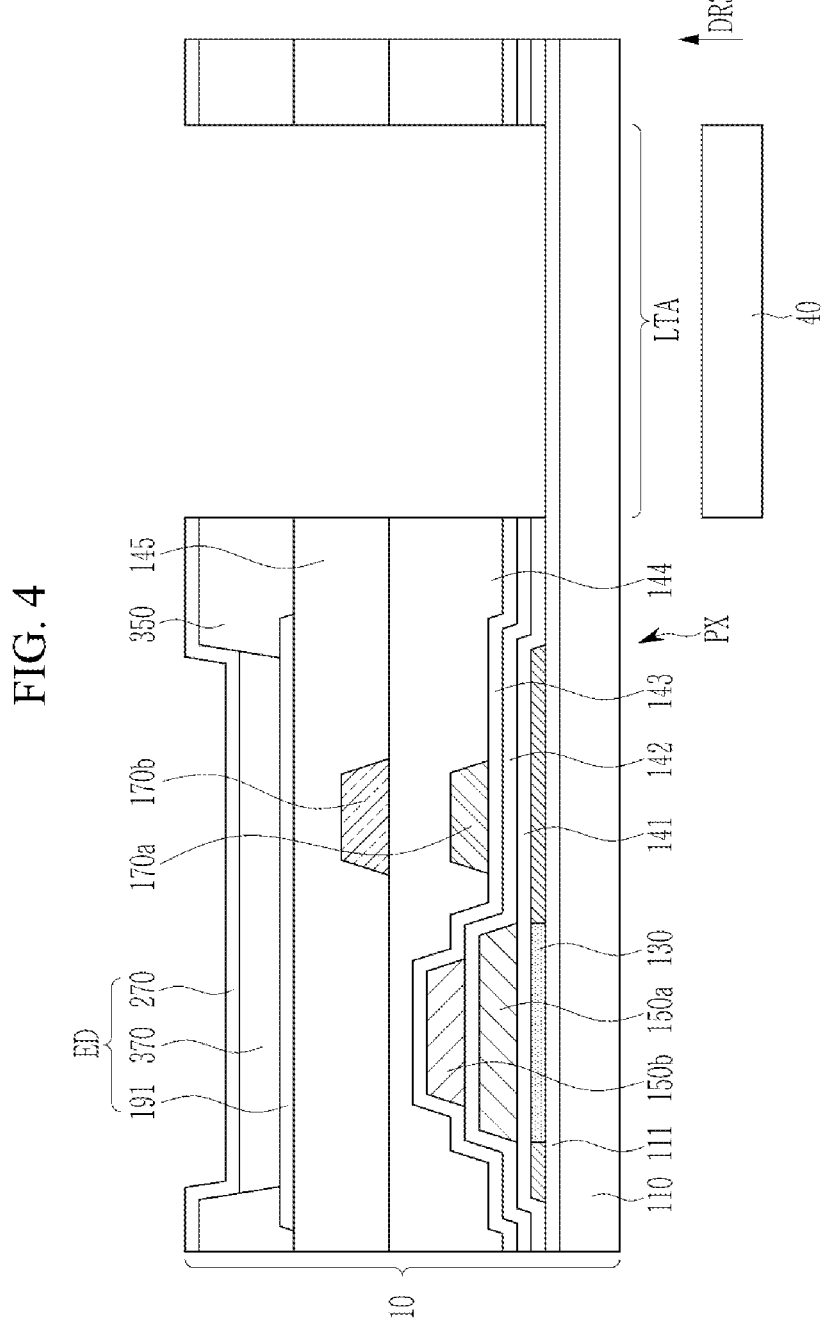
FIG. 4 is a schematic cross-sectional view of a part of a display device according to an embodiment.

Referring to FIG. 4 together with FIGS. 1, 2, and 3, a cross-sectional structure of a display device 1 according to an embodiment will be described. FIG. 4 is a schematic cross-sectional view of a part of the display device 1 according to an embodiment.

As previously described, the display device 1 according to an embodiment may include a display panel 10 and at least one optical device 40 disposed below the display panel 10 in the third direction DR3. The optical device 40 may include a camera, a flash, a sensor, and the like.

The optical device 40 may emit light through a light transmissive area LTA of the display panel 10 or receive light incident through the light transmissive area LTA.

The display panel 10 according to an embodiment may include a substrate 110 in which the first display area DA1 and the second display area DA2 described above are positioned.

A buffer layer 111 may be positioned on the substrate 110. In another example, the buffer layer 111 may be omitted.

An active layer 130 may be positioned on the buffer layer 111. The active layer 130 may include a semiconductor material such as polysilicon or an oxide semiconductor. The active layer 130 may include regions having different carrier concentrations.

An insulation layer 141 may be positioned on the active layer 130, and a first conductive layer 150*a* may be positioned on the insulation layer 141.

An insulation layer 142 may be positioned on a first conductive layer 150*a*, and a second conductive layer 150*b* may be positioned on the insulation layer 142.

An insulation layer 143 may be positioned on a second conductive layer 150*b*, and a third conductive layer 170*a* may be positioned on the insulation layer 143.

An insulation layer 144 may be positioned on a third conductive layer 170*a*, and a fourth conductive layer 170*b* may be positioned on the insulation layer 144.

At least one of the first conductive layer 150*a*, the second conductive layer 150*b*, the third conductive layer 170*a*, and the fourth conductive layer 170*b* may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), an alloy thereof, and the like, but embodiments are not limited thereto.

The first conductive layer 150*a*, the second conductive layer 150*b*, the third conductive layer 170*a*, and the fourth conductive layer 170*b* may be patterned and connected (e.g., electrically connected) to each other to form a pixel circuit portion of the pixel PX.

An insulation layer 145 may be positioned on the fourth conductive layer 170*b*, and a pixel electrode 191 may be positioned on the insulation layer 145.

At least one of the buffer layer 111, the insulation layer 141, the insulation layer 142, the insulation layer 143, the insulation layer 144, and the insulation layer 145 may include an inorganic insulation material such as a silicon nitride (SiNO, a silicon oxide (SiO$_x$), and the like, and/or an organic insulating material. For example, the insulation layer 145 may include an organic insulating material such as a polyacryl-based resin or a polyimide resin, and an upper surface of the insulation layer 145 may be substantially flat.

An insulation layer 350 may be positioned on the insulation layer 145 and the pixel electrode 191. The insulation layer 350 may be a pixel defining layer. The insulation layer

350 may have an opening positioned over the pixel electrode 191. The insulation layer 350 may include a pigment such as carbon black.

An emission layer 370 may be positioned on the pixel electrode 191. The emission layer 370 may include a portion positioned within the opening of the insulation layer 350. The emission layer 370 may include an organic light emitting material or an inorganic light emitting material.

A common electrode 270 may be positioned on the emission layer 370.

The pixel electrode 191, the emission layer 370, and the common electrode 270 may form a light emitting diode ED. A display portion of the pixel PX may include a light emitting diode ED.

A case where the display panel 10 is a light emitting display panel has been described as an example, but the structure of the display panel 10 is not limited thereto. For example, the display panel 10 may be a liquid crystal panel, an electrophoretic display panel, or an electrowetting display panel. For example, the display panel 10 may be various display panels such as a micro light emitting diode (Micro LED) display panel, a quantum dot light emitting diode (QLED) display panel, and a quantum dot organic light emitting diode (QD-OLED) display panel.

A sealing layer protecting the light emitting diode ED may be further positioned on the common electrode 270. The sealing layer may include an inorganic layer and an organic layer that are alternately stacked.

Referring to FIG. 4, the light transmissive area LTA may not include the pixel PX including the pixel circuit portion and the display portion. Layers that do not transmit light well, such as the first conductive layer 150*a*, the second conductive layer 150*b*, the third conductive layer 170*a*, and the fourth conductive layer 170*b*, may not be positioned in the light transmissive area LTA. In FIG. 4, an example in which only the buffer layer 111 remains in the light transmissive area LTA is illustrated, but embodiments are not limited thereto, and at least some of the other insulation layers 141, 142, 143, 144, 145, and 350 may remain without being removed. For example, the buffer layer 111 may also be removed from the light transmissive area LTA.

The optical device 40 positioned below the display panel 10 may emit light through the light transmissive area LTA of the display panel 10 or receive light incident through the light transmissive area LTA.

Figure 5:
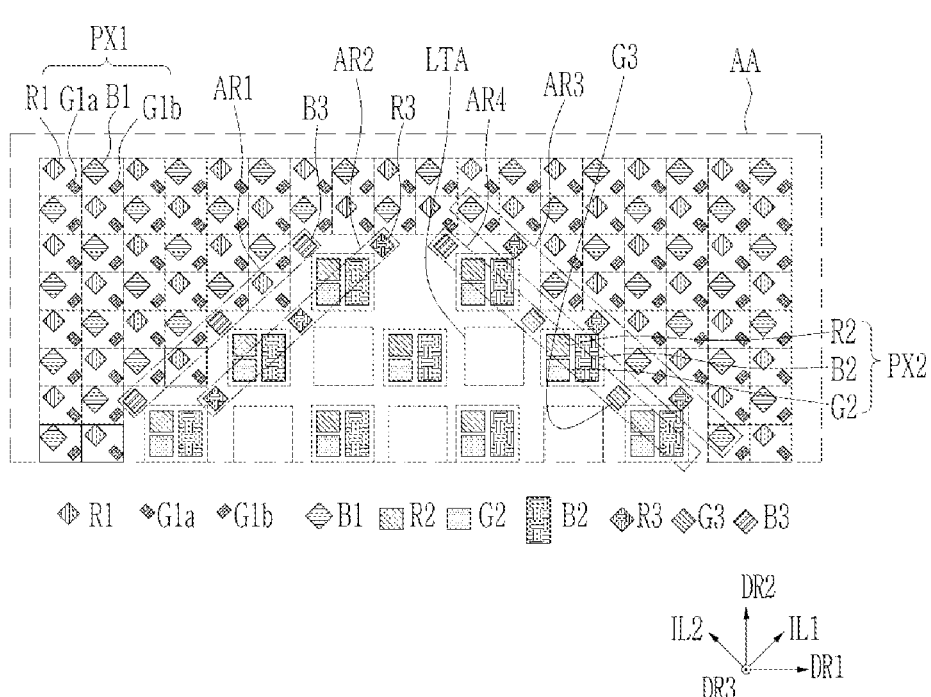
FIG. 5 is a schematic plan view of an area AA of FIG. 3.
Figure 6:
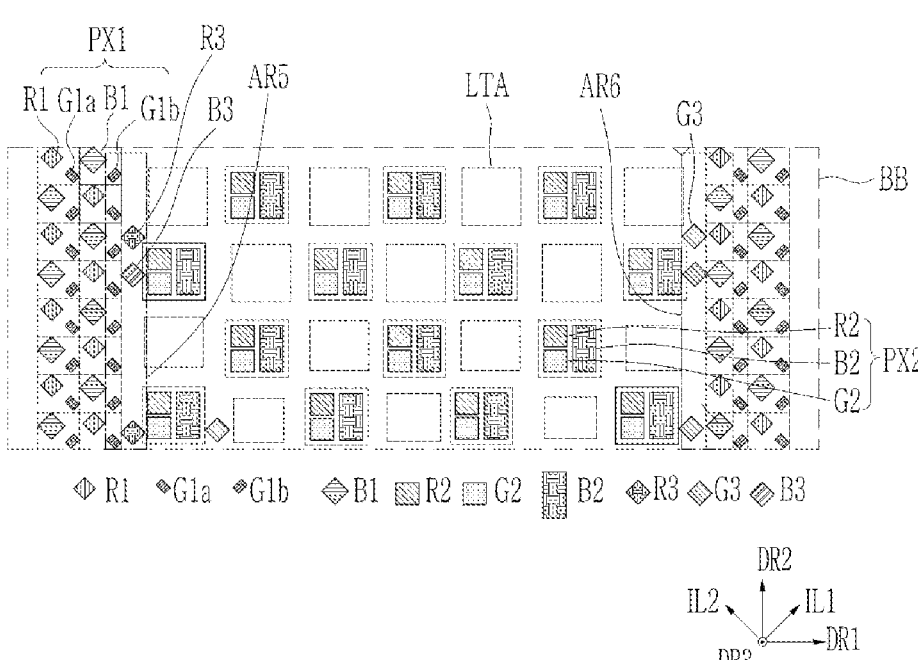
FIG. 6 is a schematic plan view of an area BB of FIG. 3.
Figure 7:
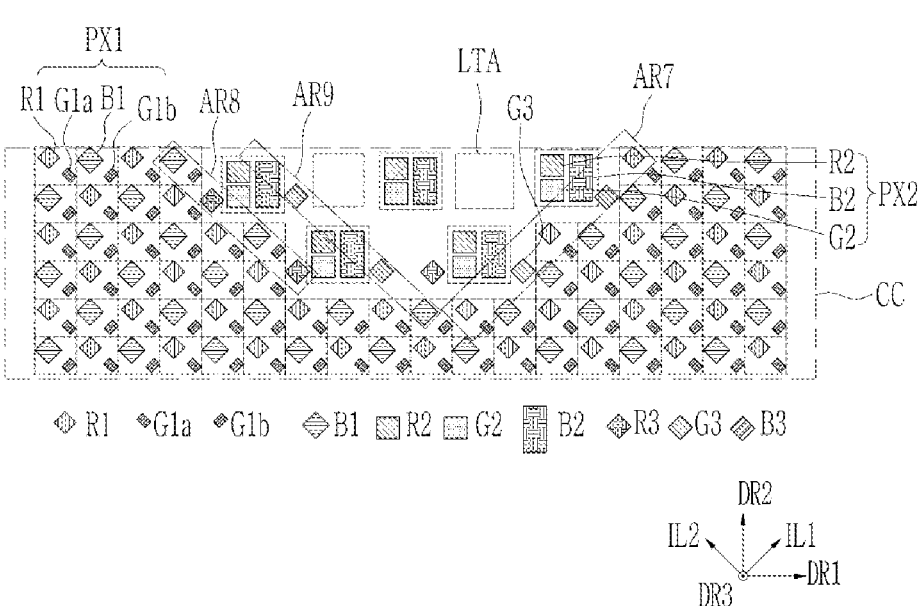
FIG. 7 is a schematic plan view of an area CC of FIG. 3.

For example, referring to FIGS. 5, 6, and 7, together with FIGS. 1, 2, 3, and 4, alignments of the first dummy pixel R3, the second dummy pixel G3, and the third dummy pixel B3 positioned at edge portions of the second display area DA2 will be described in detail. FIGS. 5, 6, and 7 are schematic plan views of parts of first and second display areas of the display device 1 according to an embodiment.

FIG. 5 is a schematic plan view of an area AA of FIG. 3 illustrating an upper portion of the second display area DA2 and a part of the first display area DA1.

Referring to FIG. 5, in the upper portion of the second display area DA2, the first pixel PX1 of the first display area DA1 may be positioned above each second pixel PX2 positioned at the edge portion of the second display area DA2.

As previously described, the first sub-pixel R1 and the third sub-pixel B1 may be positioned in an upper area of the first pixel PX1, and the second sub-pixel G1*a* and the fourth sub-pixel G1*b* may be positioned in a lower area of the first pixel PX1.

Thus, the second sub-pixel G1*a* and the fourth sub-pixel G1*b* of the first pixel PX1 of the first display area DA1 may be positioned in a portion adjacent to the upper area of the second pixel PX2 of the second display area DA2.

The fifth sub-pixel R2 and a part of the seventh sub-pixel B2 may be positioned in an upper area of the second pixel PX2. The sixth sub-pixel G2 and a part of the seventh sub-pixel B2 may be positioned in a lower side of the second pixel PX2.

In a portion adjacent to an upper area of the second pixel PX2 of the second display area DA2, the second sub-pixel G1a and the fourth sub-pixel G1b of the first pixel PX1 may be positioned adjacent to the fifth sub-pixel R2 and the seventh sub-pixel B2 of the second pixel PX2, and the third dummy pixel B3 or the second dummy pixel G3 may be positioned on the upper left of the fifth sub-pixel R2 of the second pixel PX2, and the first dummy pixel R3 may be positioned on the upper right of the seventh sub-pixel B2 of the second pixel PX2.

Referring to FIGS. 5, 6, and 7, the boundary area between the first display area DA1 and the second display area DA2 may include a first region AR1, a second region AR2, a third region AR3, a fourth region AR4, a fifth region AR5, a sixth region AR6, a seventh region AR7, an eighth region AR8, and a ninth region AR9. For example, the first region AR1, the second region AR2, the third region AR3, and the fourth region AR4 may be referred to as a first sub-area. For example, the fifth region AR5 and the sixth region AR6 may be referred to as a second sub-area. For example, the seventh region AR7, the eighth region AR8, and the ninth region AR9 may be referred to as a third sub-area. For example, in the first region AR1 in FIG. 5, the third dummy pixel B3 emitting light of a third color, the fourth sub-pixel G1b displaying the second color of the first pixel PX1, and the first sub-pixel R1 of the first pixel PX1 emitting light of the first color may be sequentially disposed along a direction parallel with a first diagonal direction IL1 that is inclined to the right from a direction parallel with the second direction DR2 along the edge portions of the second display area DA2. For example, in the second region AR2 in FIG. 5, the sixth sub-pixel G2 displaying the second color of the second pixel PX2, a portion of the seventh sub-pixel B2 displaying the third color of the second pixel PX2 and the first dummy pixel R3 displaying the first color may be sequentially disposed along a direction parallel with the first diagonal direction IL1.

For example, in the third region AR3 in FIG. 5, the third sub-pixel B1 that emits light of the third color of the first pixel PX1, the second sub-pixel G1a that displays the second color of the first pixel PX1, and the first dummy pixel R3 that light the first color may be sequentially disposed along a direction parallel with a second diagonal direction IL2 that is inclined to the left from a direction parallel with the second direction DR2 along the edge portions of the second display area DA2. For example, in the fourth region AR4 in FIG. 5, the fifth sub-pixel R2 displaying the first color of the second pixel PX2, a portion of the seventh sub-pixel B2 displaying the third color of the second pixel PX2, and the second dummy pixel G3 displaying the second color may be sequentially disposed along a direction parallel with the second diagonal direction IL2.

As described, along the direction parallel to the edge portion of the second display area DA2, the sub-pixel and dummy pixel of the first pixel PX1 or the sub-pixel and dummy of the second pixel PX2 that emit light of the first color, the second color, and the third color that are different primary colors may be sequentially disposed. Thus, sub-pixels emitting light of a specific color may not be concentratedly disposed on the boundary area between the first display area DA1 and the second display area DA2, and the sub-pixels and dummy pixels displaying the primary color may be sequentially disposed such that interference between specific colors may not occur at the boundary area between the first display area DA1 and the second display area DA2. Accordingly, display quality deterioration such as color shift may be prevented.

FIG. 6 is a schematic plan view of an area BB of FIG. 3 illustrating a middle portion of the second display area DA2 and a part of the first display area DA1.

Referring to FIG. 6, in the middle of the second display area DA2, the first dummy pixel R3 and the third dummy pixel B3 are positioned along the direction parallel to the second direction DR2 may be positioned at the left of the second pixel PX2 positioned at the edge portion of the second display area DA2, and second dummy pixels G3 may be positioned along the direction parallel with the second direction DR2 at the right side of the second pixel PX2 positioned at the edge portion of the second display area DA2.

For example, in the fifth region AR5 in FIG. 6, the second sub-pixel G1a emitting light of the second color of the first pixel PX1, the first dummy pixel R3 emitting light of the first color, the fourth sub-pixel G1b emitting light of the second color of the first pixel PX1, and the third dummy pixel B3 emitting light of the third color may be sequentially disposed to zigzag at the left edge portion of the second display area DA2. For example, in the sixth region AR6 in FIG. 6, the second dummy pixel G3 emitting light of the second color, the first sub-pixel R1 emitting light of the first color of the first pixel PX1, and the third sub-pixel B1 emitting light of the third color of the first pixel PX1 may be disposed at the right edge portion of the second display area DA2.

As described, the sub-pixel and the dummy pixel of the first pixel PX1 or the sub-pixel and the dummy pixel of the second pixel PX2 that emit light of the first color, the second color, and the third color, which are different colors, may be sequentially disposed along the direction parallel to the edge portion of the second display area DA2. Thus, the sub-pixels emitting light of a specific color may not be concentratedly disposed on the boundary area between the first display area DA1 and the second display area DA2 and the sub-pixels and dummy pixels displaying the primary color may be sequentially disposed. Accordingly, interference between specific colors may not occur at the boundary area between the first display area DA1 and the second display area DA2, and display quality deterioration such as color shift may be prevented.

FIG. 7 is a schematic plan view of an area CC of FIG. 3 illustrating a lower portion of the second display area DA2 and a part of the first display area DA1.

Referring to FIG. 7, in the lower portion of the second display area DA2, the first pixel PX1 of the first display area DA1 may be positioned below each of the second pixels PX2 positioned at the edge portion of the second display area DA2 in a plan view.

As described above, the first sub-pixel R1 and the third sub-pixel B1 may be positioned in the upper area of the first pixel PX1.

Accordingly, the first sub-pixel R1 and the third sub-pixel B1 of the first pixel PX1 of the first display area DA1 may be positioned in a portion downwardly adjacent to the second pixel PX2 of the second display area DA2 in the second direction DR2.

A portion of the sixth sub-pixel G2 and the seventh sub-pixel B2 may be positioned below the second pixel PX2 in a plan view.

In a portion adjacent below the second pixel PX2 of the second display area DA2, the first dummy pixel R3 may be positioned at lower left of the sixth sub-pixel G2 of the second pixel PX2 and the second dummy pixel G3 may be positioned at lower right of the seventh sub-pixel B2 of the second pixel PX2 along a direction parallel with the first direction DR1.

For example, in the seventh region AR7 in FIG. 7, the first sub-pixel R1 emitting light of the first color of the first pixel PX1, the seventh sub-pixel B2 emitting light of the third color of the second pixel PX2, and the second dummy pixel G3 emitting light of the second color may be sequentially disposed along a direction parallel with the first diagonal direction IL1 that is diagonal to the light from a direction parallel with the second direction DR2 along the edge portion of the second display area DA2.

For example, in the eighth region AR8 in FIG. 7, the third sub-pixel B1 emitting light of the third color of the first pixel PX1, the fourth sub-pixel G1b displaying the second color of the first pixel PX1, and the first dummy pixel R3 emitting light of the first color may be sequentially disposed along a direction parallel with a second diagonal direction IL2 that is diagonal to the light from a direction parallel with the second direction DR2 along the edge portion of the second display area DA2. For example, in the ninth region AR9 in FIG. 7, the fifth sub-pixel R2 displaying the first color of the second pixel PX2, a portion of seventh sub-pixel B2 displaying the third color of the second pixel PX2, and the second dummy pixel G3 displaying the second color may be sequentially disposed along a direction parallel with a second diagonal direction IL2.

As described, the sub-pixel and the dummy pixel of the first pixel PX1 or the sub-pixel and the dummy pixel of the second pixel PX2 that emit light of the first color, the second color, and the third color, which are different colors, may be sequentially disposed along the direction parallel to the edge portion of the second display area DA2. Thus, the sub-pixels emitting light of a specific color may not be concentratedly disposed on the boundary area between the first display area DA1 and the second display area DA2 and the sub-pixels and dummy pixels displaying the primary color may be sequentially disposed. Accordingly, interference between specific colors may not occur at the boundary area between the first display area DA1 and the second display area DA2, and display quality deterioration such as color shift may be prevented.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a plurality of first pixels disposed in a first pixel area, each of the plurality of first pixels including a plurality of first sub-pixel groups;
a plurality of second pixels disposed in a second pixel area surrounded by the first pixel area, each of the plurality of second pixels including a plurality of second sub-pixel groups, at least one of the plurality of second sub-pixel groups including a different total number of sub-pixels than at least one of the plurality of first sub-pixel groups; and
a plurality of dummy pixels disposed at edge portions of the second pixel area, wherein a pixel density of the second pixel area is lower than a pixel density of the first pixel area, and
the plurality of dummy pixels are configured to emit lights of different colors and are differently arranged according to positions of the edge portions of the second pixel area such that sub-pixels among the plurality of second pixels adjacent to respective ones of the edge portions are configured to emit a color of light different from those of respective dummy pixels of the plurality of dummy pixels adjacent thereto,
wherein the plurality of first sub-pixel groups comprise a first sub-pixel, a second sub-pixel, a third sub-pixel, and a fourth sub-pixel,
the plurality of second sub-pixel groups comprise a fifth sub-pixel, a sixth sub-pixel, and a seventh sub-pixel,
the plurality of dummy pixels comprise a first dummy pixel, a second dummy pixel, and a third dummy pixel,
the first sub-pixel, the fifth sub-pixel, and the first dummy pixel emit light of a first color,
the second sub-pixel, the fourth sub-pixel, the sixth sub-pixel, and the second dummy pixel emit light of a second color, and
the third sub-pixel, the seventh sub-pixel, and the third dummy pixel emit light of a third color,
wherein the first dummy pixel is disposed between the sixth sub-pixel and the seventh sub-pixel,
the second dummy pixel is disposed between the seventh sub-pixel and the fifth sub-pixel, and
the third dummy pixel is adjacent to the fifth sub-pixel.

2. The display device of claim 1, wherein
the first sub-pixel, the second sub-pixel, the third sub-pixel, and the fourth sub-pixel are sequentially disposed in a zigzag pattern along a first direction and a second direction in a plan view,
the sixth sub-pixel is disposed below the fifth sub-pixel along the second direction in a plan view, and
the seventh sub-pixel is adjacent to the fifth sub-pixel and the sixth sub-pixel along the first direction in a plan view.

3. The display device of claim 2, wherein, in a first region of a boundary area between the first pixel area and the second pixel area, the first sub-pixel, the fourth sub-pixel, and the third dummy pixel are sequentially disposed along a first diagonal direction between the first direction and the second direction.

4. The display device of claim 3, wherein, in a second region of the boundary area between the first pixel area and the second pixel area, the seventh sub-pixel, the first dummy pixel, and the sixth sub-pixel are sequentially disposed along the first diagonal direction.

5. The display device of claim 4, wherein, in a third region of the boundary area between the first pixel area and the second pixel area, the third sub-pixel, the fourth sub-pixel, and the first dummy pixel are sequentially disposed along a second diagonal direction between the first direction and the second direction.

6. The display device of claim 5, wherein, in a fourth region of the boundary area between the first pixel area and the second pixel area, the fifth sub-pixel, the seventh sub-pixel, and the second dummy pixel are sequentially disposed along the second diagonal direction.

7. The display device of claim 2, wherein, in a fifth region of a boundary area between the first pixel area and the second pixel area, the first dummy pixel and the third dummy pixel are disposed along the second direction in a portion adjacent between the second sub-pixel and the fourth sub-pixel.

8. The display device of claim 7, wherein, in a sixth region of the boundary area between the first pixel area and the second pixel area, the second dummy pixel is disposed along the second direction in a portion adjacent to the first sub-pixel and the third sub-pixel.

9. The display device of claim 2, wherein, in a seventh region of a boundary area between the first pixel area and the second pixel area, the first sub-pixel, the seventh sub-pixel, and the second dummy pixel are sequentially disposed along a first diagonal direction between the first direction and the second direction.

10. The display device of claim 9, wherein, in an eighth region of the boundary area between the first pixel area and the second pixel area, the third sub-pixel, the fourth sub-pixel, and the first dummy pixel are sequentially disposed along a second diagonal direction between the first direction and the second direction.

11. The display device of claim 10, wherein, in a ninth region of the boundary area between the first pixel area and the second pixel area, the fifth sub-pixel, the seventh sub-pixel, and the second dummy pixel are sequentially disposed along the second diagonal direction.

12. A display device comprising:

a plurality of first pixels disposed in a first pixel area, each of the plurality of first pixels including a plurality of first sub-pixel groups;

a plurality of second pixels disposed in a second pixel area surrounded by the first pixel area, each of the plurality of second pixels including a plurality of second sub-pixel groups; and a plurality of dummy pixels disposed at edge portions of the second pixel area, wherein a size of a light emitting portion of a dummy pixel among the plurality of dummy pixels is smaller than a size of a light emitting portion of a second sub-pixel group among the plurality of second sub-pixel groups, and the size of the light emitting portion of the dummy pixel is substantially equivalent to a size of a light emitting portion of at least one sub-pixel among sub-pixels of the plurality of first sub-pixel groups, the plurality of dummy pixels are configured to emit lights of different colors and are differently arranged according to positions of the edge portions of the second pixel area such that sub-pixels among the plurality of second pixels adjacent to respective ones of the edge portions are configured to emit a color of light different from those of respective dummy pixels of the plurality of dummy pixels adjacent thereto, wherein the plurality of first sub-pixel groups comprise a first sub-pixel, a second sub-pixel, a third sub-pixel, and a fourth sub-pixel, the plurality of second sub-pixel groups comprise a fifth sub-pixel, a sixth sub-pixel, and a seventh sub-pixel, the plurality of dummy pixels comprise a first dummy pixel, a second dummy pixel, and a third dummy pixel, the first sub-pixel, the fifth sub-pixel, and the first dummy pixel emit light of a first color, the second sub-pixel, the fourth sub-pixel, the sixth sub-pixel, and the second dummy pixel emit light of a second color, and the third sub-pixel, the seventh sub-pixel, and the third dummy pixel emit light of a third color, wherein in the first pixel area, the first sub-pixel, the second sub-pixel, the third sub-pixel, and the fourth sub-pixel are sequentially disposed in a zigzag pattern along a first direction and a second direction in a plan view, and in the second pixel area, the sixth sub-pixel is disposed below the fifth sub-pixel along the second direction, and the seventh sub-pixel is disposed adjacent to the fifth sub-pixel and the sixth sub-pixel along the first direction in a plan view, wherein in a first sub-area of a boundary area between the first pixel area and the second pixel area, the first sub-pixel, the fourth sub-pixel, and the third dummy pixel are sequentially disposed along a first diagonal direction between the first direction and the second direction, and in the first sub-area, the seventh sub-pixel, the first dummy pixel, and the sixth sub-pixel are sequentially disposed along the first diagonal direction.

13. The display device of claim 12, wherein in the first sub-area, the third sub-pixel, the fourth sub-pixel, and the first dummy pixel are sequentially disposed along a second diagonal direction between the first direction and the second direction, and in the first sub-area, the fifth sub-pixel, the seventh sub-pixel, and the second dummy pixel are sequentially disposed along the second diagonal direction.

14. The display device of claim 13, wherein in a second sub-area of the boundary area between the first pixel area and the second pixel area, the first dummy pixel and the third dummy pixel are disposed between the second sub-pixel and the fourth sub-pixel along the second direction, and in the second sub-area, the second dummy pixel is disposed to a portion adjacent to the first sub-pixel and the third sub-pixel along the second direction.

15. The display device of claim 14, wherein in a third sub-area of the boundary area between the first pixel area and the second pixel area, the first sub-pixel, the seventh sub-pixel, and the second dummy pixel are sequentially disposed along the first diagonal direction.

16. The display device of claim 15, wherein in the third sub-area, the third sub-pixel, the fourth sub-pixel, and the first dummy pixel are sequentially disposed along the second diagonal direction, and in the third sub-area, the fifth sub-pixel, the seventh sub-pixel, and the second dummy pixel are sequentially disposed along the second diagonal direction.

* * * * *